United States Patent [19]
Oh et al.

[11] Patent Number: 5,250,840
[45] Date of Patent: Oct. 5, 1993

[54] SEMICONDUCTOR LEAD FRAME WITH A CHIP HAVING BONDING PADS IN A CROSS ARRANGEMENT

[75] Inventors: Dong Y. Oh; Hyeon J. Jeong, both of Incheon; Heung K. Kwon, Bucheon, all of Rep. of Korea

[73] Assignee: Samsung Electronics Co., Ltd., Suweon, Rep. of Korea

[21] Appl. No.: 6,202

[22] Filed: Jan. 19, 1993

Related U.S. Application Data

[63] Continuation of Ser. No. 874,610, Apr. 27, 1992, abandoned.

[30] Foreign Application Priority Data

Feb. 24, 1992 [KR] Rep. of Korea ............ 92-2797

[51] Int. Cl.⁵ ............................................. H01L 23/48
[52] U.S. Cl. ............................ 257/666; 257/676; 257/786
[58] Field of Search ............. 357/70, 68; 257/666, 257/676, 786

[56] References Cited

U.S. PATENT DOCUMENTS 4,916,519 4/1990 Ward .......................... 357/70
5,016,082 5/1991 Roth .......................... 357/70

FOREIGN PATENT DOCUMENTS 1-205541 8/1989 Japan .
2-2246235 10/1990 Japan .

Primary Examiner—Rolf Hille
Assistant Examiner—S. V. Clark
Attorney, Agent, or Firm—Ladas & Parry

[57] ABSTRACT

A semiconductor lead frame is disclosed to improve the characteristics and reliability of a semiconductor device using lines of bonding pads in a cross-arrangement. The semiconductor lead frame comprises a rectangular semiconductor chip with a plurality of output terminals of associated circuits, a plurality of leads having inner and outer ends, bus bars extending around the inner ends of the leads, at least one insulator disposed between the semiconductor chip and the inner ends of the leads for electrically insulating the chip and the leads, metal wires electrically connecting the inner ends of the leads to selected and respective bonding pads and the bus bars to the pads in common. The leads are inclined relative to the lines of pads to form a line of outer terminals for the lead frame which extend over a distance exceeding the length of the chip. The semiconductor device can thereby accommodate a great number of bonding pads in response to the high density demand without increasing the size of the chip.

8 Claims, 1 Drawing Sheet

SEMICONDUCTOR LEAD FRAME WITH A CHIP HAVING BONDING PADS IN A CROSS ARRANGEMENT

This is a continuation of copending application Ser. No. 07/874,610 filed on Apr. 27, 1992 now abandoned.

BACKGROUND OF THE INVENTION

This invention relates to a semiconductor lead frame, and more particularly to, a semiconductor lead frame which improves the characteristics and reliability of a semiconductor device using a chip having bonding pads arranged in a cross.

The recent tendency of semiconductors toward high levels of integration with requirements for many inputs and outputs, and high-function makes semiconductor package technology evermore critical. Therefore, it is necessary for a semiconductor lead frame to have greater connection capacity with a high pin count.

In conventional semiconductor package technology, the semiconductor chip is mounted on a lead frame after depositing adhesive materials such as an epoxy on a die pad of the lead frame. In order to miniature the size of the semiconductor package, however, COL(Chip On Lead) or LOC(Lead On Chip) are employed for directly attaching the chip on the lead frame without the die pad, so as to improve the reliability and design of the semiconductor package regardless of the die pad. The LOC has further advantages that it is not necessary to alter the position of a pad of the chip for its predetermined position in response to various kinds of semiconductor packages.

In a conventional structure as illustrated in FIG. 1, the LOC is a straight-shaped lead frame and comprises a rectangular semiconductor chip 10 provided with a plurality of output terminals and associated circuits inner leads 12 having a middle portion of which one side is protruded, and a small and narrow width, the inner leads 12 being arranged with a wide spacing, a plurality of outer leads 16 having outer ends 14 extending at a distance from the inner leads 12 and connected with the inner leads 12, a bus bar 24 formed around the leads 12, at least one insulator 18 disposed between the semiconductor chip 10 and the inner leads 12 for electrically insulating the same, metal wires 20 electrically connecting the inner leads 12 to bonding pads 22 in straight lines arranged at the center portion of the semiconductor chip 10 adjacent to the ends of the inner leads 12, and supporting bar 26 for supporting the inner leads 12. This semiconductor lead frame is suitable for a low pin count package but in a high pin count package, it has a problem in that the size of the chip cannot be increased to increase the number of pins. Accordingly, this results in a further problem that the cost is increased and the properties become degraded.

SUMMARY OF THE INVENTION

An object of this invention is to provide a novel semiconductor lead frame which improves the high reliability and properties in a semiconductor assembling process using a chip having bonding pads arranged in a cross.

Another object of this invention is to provide a semiconductor lead frame which can arrange the bonding of the chip arbitrarily and design the lead frame simply.

Still another object of this invention is to provide a semiconductor lead frame wherein the bus bar can be freely designed in number.

According to the present invention, this object is achieved by a semiconductor lead frame comprising a semiconductor chip of rectangular shape provided with a plurality of output terminals and associated circuits, a plurality of leads having inner and outer bus bars located around the inner ends of the plurality of leads, at least one insulator disposed between the semiconductor chip and the inner ends of the leads for electrically insulating the inner pads from the chip, and metal wires electrically connecting the inner ends of the leads to a plurality of bonding pads arranged in the shape of a cross for electrically connecting the leads to the chip.

BRIEF DESCRIPTION OF THE DRAWINGS

The above and other objects and features of the present invention will become apparent from the description of the preferred embodiment of the present invention with reference to the attached drawings, in which.

DESCRIPTION OF THE PREFERRED EMBODIMENTS

Figure 1:
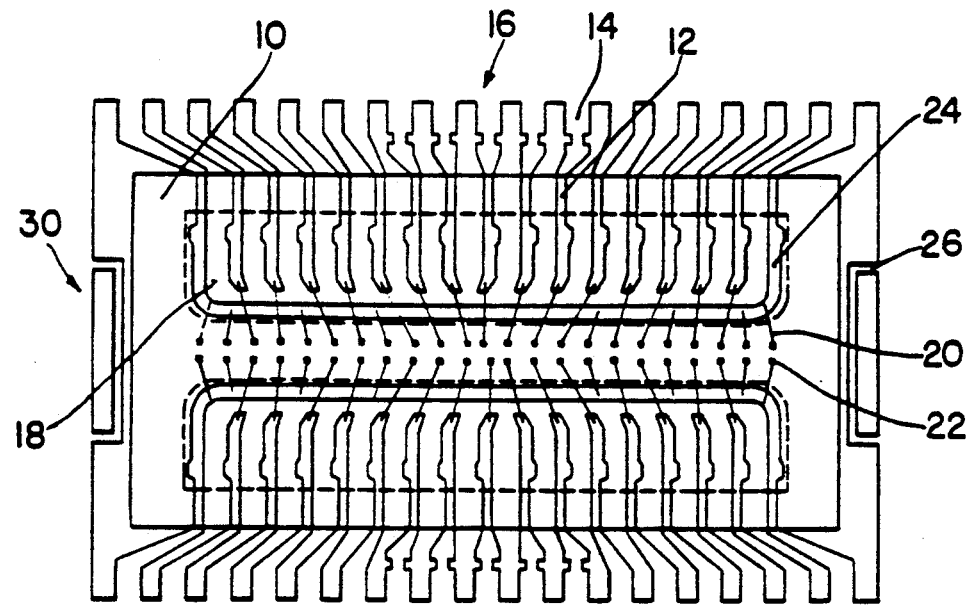
FIG. 1 is a plan view showing a prior art lead frame for Lead on Chip.
Figure 2:
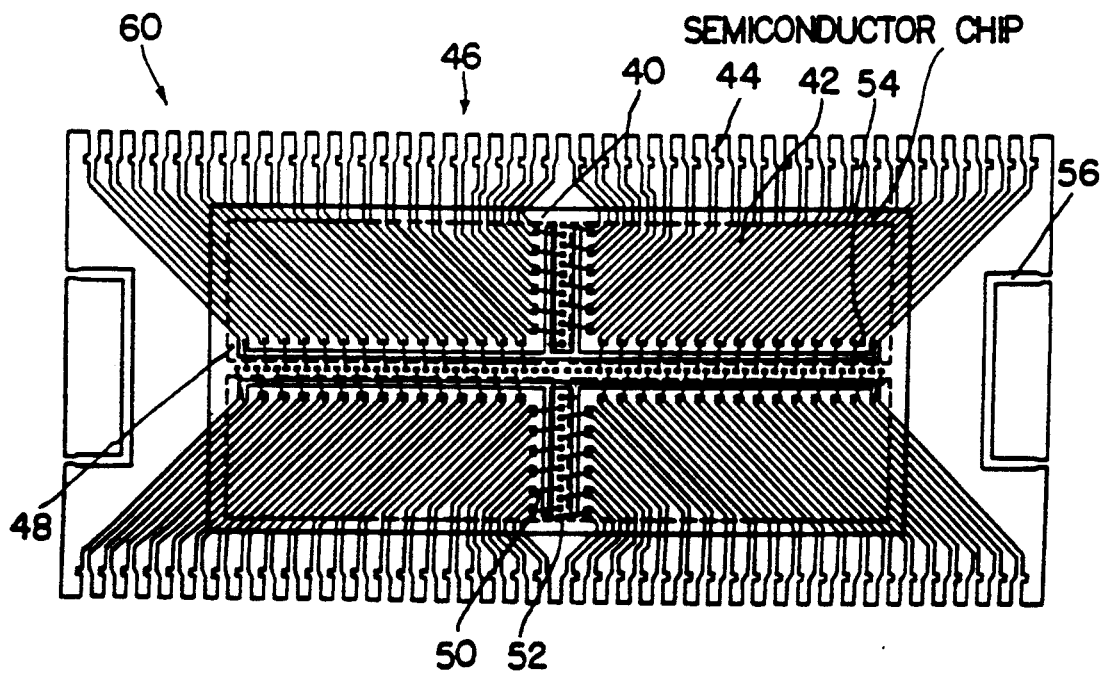
FIG. 2 is a plan view showing a preferred embodiment of a lead frame for a Lead on Chip of this invention.

FIG. 2 is a plan view showing a preferred embodiment of a semiconductor lead 60 frame of this invention. The semiconductor lead frame 60 comprises a rectangular semi-conductor chip 40 having length and width dimensions and including a plurality of bonding pads 52 arranged in a horizontal row and a vertical column in respective bands confined in central regions of the chip, the row and column of pads extending at right angles to one another to form a cross-arrangement. The cross-arrangement of the bonding pads 52 of the chip provides as many pins as possible. The bonding pads 52 in each row or column are disposed at a predetermined spacing, which may be varied according to the purpose of the user. The semiconductor lead frame 60 further comprises inner leads 42 included at an angle of 30° to 60° relative to the bands. In the semiconductor lead frame 60, two to four bus bars 54 are provided according to the purpose of the user for common connection of selected pads 52 to respective outer terminals 56. The semiconductor lead frame 60 includes metal wires 50 electrically connecting the inner leads 42 with selected bonding pads 52. The inner leads 42 are connected to outer lead portions 44 which form respective outer terminals 56. Also, the bus bars 54 extend along the row and column of the pads 52 and are electrically connected with other selected bonding pads 52, in common, by the wire bonding. As evident in FIG. 2, the cross-arrangement of the pads 52 forms four adjoining quadrants in the chip and the inner leads 42 are inclined at opposite angles of inclination in adjoining quadrants such that the distance covered by the outer terminals 46 extend beyond the ends of the chip 40. Therefore, it will be apparent that an improved lead frame is provided with high density and increased capacity.

In the embodiment of invention described above, the a semiconductor device with high pin density can be used by the semiconductor lead frame corresponding to the high density semiconductor elements. Also, according to the present invention, the LOC can be provided with high pin density for the in a same size chip, and the noise of the device can be reduced thereby shortening the length of the wire extending to the pad of the chip. Further, the bus bar construction can be designed more freely by varying the number of bus bars.

The invention is in no way limited to the embodiment described hereinabove. Various modifications of the disclosed embodiment as well as other embodiments of the invention will become apparent to persons skilled in the art upon reference to the description of the invention. It is, therefore, contemplated that the appended claims will cover any such modifications or embodiments as fall within the true scope of the invention.

What is claimed is:

1. A semiconductor lead frame comprising a rectangular semiconductor chip having length and width dimensions, said chip including a plurality of bonding pads which enable external connection of circuits contained in said chip, said bonding pads being aranged in bands confined in central regions of said chip extending in the length and width directions of the chip at right angles to one another to form a cross-arrangement of said pads, a plurality of leads having inner and outer ends, a plurality of bus bars, insulator means for electrically insulating said chips and said leads, and a plurality of metal wires respectively electrically connecting said inner ends of said leads to selected ones of said bonding pads, and said bus bars, in common, to other selected ones of said bonding pads.

2. A semiconductor lead frame according to claim 1, wherein said leads extend at an angle of inclination relative to said bands at between 30° and 60°.

3. A semiconductor lead frame according to claim 1, wherein said bus bars are one of two and four in number.

4. A semiconductor lead frame according to claim 3, wherein said bus bars extend in proximity to said bands.

5. A semiconductor lead frame according to claim 1, wherein said bonding pads are arranged in a single line in each of said bands to form one row of pads and one column of pads on said chip.

6. A semiconductor lead frame according to claim 2, wherein said bands divide said chip into four adjoining quadrants, said leads extending at opposite angles of inclination in said adjoining quadrants.

7. A semiconductor lead frame according to claim 6, wherein said leads are inclined in said quadrants in directions so that said outer ends of the leads from terminals which extend over a length greater than the length of said chip.

8. A semiconductor lead frame according to claim 6, comprising separate leads connected to said bus bars and forming outlet terminals for the selected pads connected in common to the bus bars.

* * * * *